(12) United States Patent
Heinrich et al.

(10) Patent No.: US 10,947,619 B2
(45) Date of Patent: Mar. 16, 2021

(54) PROCESSING ARRANGEMENT AND METHOD FOR CONDITIONING A PROCESSING ARRANGEMENT

(71) Applicant: VON ARDENNE Asset GmbH & Co. KG, Dresden (DE)

(72) Inventors: Sven Heinrich, Dresden (DE); Michael Brandt, Coswig (DE); Daniel Stange, Dresden (DE); Damir Muchamedjarow, Bannewitz (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 122 days.

(21) Appl. No.: 16/027,396

(22) Filed: Jul. 5, 2018

(65) Prior Publication Data

US 2019/0024229 A1 Jan. 24, 2019

(30) Foreign Application Priority Data

Jul. 24, 2017 (DE) ...................... 10 2017 116 650.5

(51) Int. Cl.
*C23C 14/56* (2006.01)
*C23C 16/455* (2006.01)
(Continued)

(52) U.S. Cl.
CPC ............ *C23C 14/564* (2013.01); *C23C 14/24* (2013.01); *C23C 14/541* (2013.01);
(Continued)

(58) Field of Classification Search
CPC .............. C23C 14/564; C23C 16/4401; C23C 16/45519; H01J 37/3244; H01J 37/32458
See application file for complete search history.

(56) References Cited

U.S. PATENT DOCUMENTS 5,248,349 A * 9/1993 Foote .................. H01L 31/1836
136/260
5,366,764 A * 11/1994 Sunthankar ........... C23C 14/564
427/248.1

(Continued)

FOREIGN PATENT DOCUMENTS

DE 102015107297 A1 11/2016

OTHER PUBLICATIONS

German Search Report based on application No. 10 2017 116 650 5 (6 pages) dated Feb. 7, 2018 (for reference purpose only).

*Primary Examiner* — Binu Thomas
(74) *Attorney, Agent, or Firm* — Viering, Jentschura & Partner Mbb (57) ABSTRACT

A processing arrangement comprising: a process chamber comprising an upper chamber wall, a lower chamber wall and two lateral chamber walls; an insulating structure, arranged between the processing region and each of the upper chamber wall, the lower chamber wall and the two lateral chamber walls, respectively, for thermally insulating the processing region, wherein the insulating structure is configured as gas-permeable at least in sections in such a way that a process gas from the processing region can flow out of the processing region in the direction in each of the upper chamber wall, the lower chamber wall and the two lateral chamber walls, respectively, through the insulating structure; and a gas channel, arranged between the insulating structure and each of the upper chamber wall, the lower chamber wall and the two lateral chamber walls, respectively, for pumping away the process gas which flows through the insulating structure.

13 Claims, 4 Drawing Sheets

(51) Int. Cl.
*C23C 14/24* (2006.01)
*C23C 14/54* (2006.01)
*C23C 16/44* (2006.01)

(52) U.S. Cl.
CPC ........ *C23C 16/4401* (2013.01); *C23C 16/455* (2013.01); *C23C 16/4404* (2013.01); *C23C 16/45591* (2013.01)

(56) References Cited

U.S. PATENT DOCUMENTS

| | | | |
|---|---|---|---|
| 2005/0147751 A1* | 7/2005 | Sarigiannis | C23C 16/455 427/248.1 |
| 2011/0142746 A1* | 6/2011 | Reed | C23C 14/564 118/724 |
| 2012/0118541 A1* | 5/2012 | Von Der Waydbrink | C23C 14/541 165/135 |
| 2013/0323420 A1* | 12/2013 | Knaapan | C23C 16/46 427/248.1 |
| 2014/0076362 A1* | 3/2014 | Von Der Waydbrink | C23C 14/564 134/19 |
| 2015/0059981 A1* | 3/2015 | Huston | C23C 16/4409 156/345.52 |
| 2015/0368793 A1* | 12/2015 | von der Waydbrink | C23C 16/4581 427/532 |

* cited by examiner

PROCESSING ARRANGEMENT AND METHOD FOR CONDITIONING A PROCESSING ARRANGEMENT

CROSS-REFERENCE TO RELATED APPLICATIONS

This application claims priority to German Application 10 2017 116 650.5, filed on Jul. 24, 2017, the contents of which are incorporated herein by reference.

TECHNICAL FIELD

Various exemplary embodiments relate to a processing arrangement and to a method for conditioning a processing arrangement.

BACKGROUND

In general, many different methods are used for processing substrates. By way of example, glass sheets, plastic plates, metal strips, films, wafers, workpieces or the like can be used as substrates. The substrates can be processed for example by means of a processing device, e.g. can be coated by means of a coating device, can be cleaned or structured by means of an etching device, can be subjected to a thermal treatment by means of a heating device and/or a cooling device, or the like. In this case, the substrates are conventionally processed in at least one processing region in a process chamber. By way of example, a vacuum process chamber, an atmospheric pressure process chamber or an excess pressure process chamber can be used as the process chamber. In this case, the substrates can be processed individually or in an assemblage.

SUMMARY

In general, it may be necessary to provide predefined process conditions in a processing region of a process chamber; by way of example, a substrate in the processing region can be heated to a predefined temperature, be exposed to a process gas, be exposed to a material vapor composed of coating material, or material can be removed from a substrate (e.g. by means of etching, grinding, etc.). In this case, it may be necessary or helpful if the lowest possible water partial pressure prevails in the processing region (i.e. illustratively the amount of water vapor in the processing region is small), since water can disturb coating processes or other processes, for example.

Furthermore, it may be helpful to thermally insulate a processing region in a process chamber, i.e. to provide a thermal insulation structure within the process chamber. In this case, a thermal insulation structure can consist for example of a porous material having a low thermal conductivity. However, a porous material can bind a large amount of water comparatively strongly (as adsorbate on the internal surface of the porous material), such that a conditioning of the process chamber, i.e. illustratively the run-in of the processes (for example after maintenance of the installation) until the desired and/or required conditions prevail, may require a comparatively long time. By way of example, it may be necessary for the process chamber to be baked from inside together with the thermal insulation structure for a number of hours and to be pumped out in the process until the residual gas partial pressure of the water lies in a range striven for.

One aspect of various embodiments may illustratively be seen in providing a processing arrangement and also a method for operating (e.g. for conditioning) a processing arrangement which make it possible, during the operation (e.g. during the initial start-up and/or after maintenance) of the processing arrangement, to achieve the required and/or desired process conditions as rapidly and cost-effectively as possible. This can be effected firstly by means of correspondingly configured baking of the process chamber (in particular baking of a thermal insulation arranged in the process chamber) and secondly by means of a correspondingly provided gas flow in the processing region, wherein these measures can be realized individually or simultaneously in order to remove for example water vapor or other disturbing gases efficiently from the processing region or the process chamber.

In accordance with various embodiments, a processing arrangement may include the following: a process chamber for processing a substrate within a processing region, wherein the process chamber includes an upper chamber wall, a lower chamber wall and two lateral chamber walls; an insulating structure, which is arranged between the processing region and each of the upper chamber wall, the lower chamber wall and the two lateral chamber walls, respectively, for thermally insulating the processing region, wherein the insulating structure is configured as gas-permeable at least in sections in such a way that a process gas from the processing region can flow out of the processing region in the direction of each of the upper chamber wall, the lower chamber wall and the two lateral chamber walls, respectively, through the insulating structure; and a gas channel, which is arranged between the insulating structure and each of the upper chamber wall, the lower chamber wall and the two lateral chamber walls, respectively, for pumping away the process gas which flows through the insulating structure.

In accordance with various embodiments, a method for operating (e.g. for conditioning) a processing arrangement can comprise the following: operating a heater arrangement and/or a processing device within a processing region of the processing arrangement and thereby heating a surface of an insulating structure, said surface being exposed toward the processing region, to a first temperature; and subsequently operating the heater arrangement and/or the processing device and thereby heating the surface of the insulating structure, said surface being exposed toward the processing region, to a second temperature, which is lower than the first temperature. Afterward, by way of example, a substrate can be processed (e.g. coated) in the processing region (e.g. in a coating region).

In accordance with various embodiments, a processing arrangement can comprise the following: a process chamber for processing a substrate within a processing region; an insulating structure, which is arranged between the processing region and an inner chamber wall of the process chamber, for thermally insulating the processing region from the process chamber; and a heating structure for heating the insulating structure, wherein the insulating structure is arranged partly or completely between the heating structure and the processing region.

In accordance with various embodiments, a method for operating (e.g. for conditioning) a processing arrangement can comprise the following: operating a heater arrangement and/or a processing device within a processing region of a processing arrangement and thereby heating a surface of an insulating structure, said surface being exposed toward the processing region; and, at the same time, additionally heating the insulating structure by means of a heating structure, wherein the insulating structure is arranged partly or completely between the heating structure and the processing region. Afterward, by way of example, a substrate can be processed (e.g. coated) in the processing region (e.g. in a coating region).

Exemplary embodiments are illustrated in the figures and are explained in greater detail below.

DESCRIPTION

In the following detailed description, reference is made to the accompanying drawings, which form part of this description and show for illustration purposes specific embodiments in which the invention can be implemented. In this regard, direction terminology such as, for instance, at the top, at the bottom, at the front, at the back, front, rear, etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and indirect connection and a direct or indirect coupling. In the figures, identical or similar elements are provided with identical reference signs, insofar as this is expedient.

In accordance with various embodiments, it is possible to use the method described herein for operating (e.g. conditioning) a processing arrangement for vacuum installations in a pressure range of, for example, 0.1 mbar up to atmospheric pressures or up to excess pressures. If the processing arrangement is intended to be operated in a pressure range of less than the respective atmospheric pressure, the process chamber is correspondingly configured as a vacuum chamber.

It is conventional practice to use baking of vacuum chambers and of the fittings for the operation thereof in the high- and ultrahigh-vacuum range. For the operation of the installations in this low pressure range, special materials that outgas only to a small extent in this pressure range have to be used for all fittings. Therefore, metals having a low vapor pressure are not used. Moreover, cavities that cannot be sufficiently evacuated are avoided, since they can produce a so-called virtual leak, with the result that the installation generally cannot be operated efficiently. Therefore, porous materials are also not used in these installations in the high- and in particular ultrahigh-vacuum range.

In the high-vacuum range, for thermal insulation it is conventional practice to use shielding plates, which can be arranged in a plurality of layers relative to one another. The shielding plates prevent heat transfer on the basis of thermal radiation, for example. A gap between two adjacent shielding plates in each case prevents heat transfer on the basis of heat conduction, for example.

As soon as the pressure reaches values of around 0.1 mbar and above up to atmospheric pressures, however, heat conduction and increasingly also free convection heat transfer via the gas situated in the process chamber are manifested, such that for example shielding plates alone cannot bring about sufficient heat insulation.

In these pressure ranges, heat insulation can be implemented cost-effectively using thermally stable, highly porous, usually ceramic materials, but with the disadvantage that long conditioning times for the desorption of water may be necessary on account of the very large internal surface area of the heat insulation. Particularly if only very small water vapor contaminations of the process gas atmosphere can be afforded tolerance, in practice depending on requirements in respect of the permissible water vapor partial pressure the water vapor desorption may take up a few 10 hours, which hugely decreases the availability of the installation, for example.

Measures for shortening the conditioning times in particular with regard to possible water desorption in the interior of the process chamber are described in detail below. Furthermore, measures are described, which are suitable for eliminating or reducing the influence of the water desorption on the process gas atmosphere within the process environment.

Figure 1:
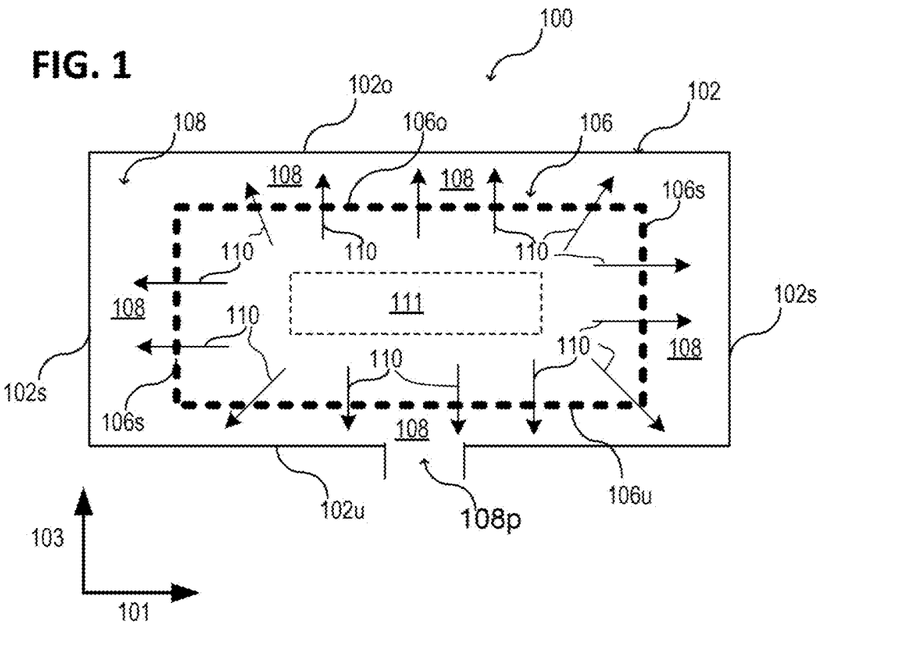
FIG. 1 shows a processing arrangement in a schematic side or cross-sectional view, in accordance with various embodiments.

FIG. 1 illustrates a processing arrangement 100, which is configured in accordance with various embodiments in such a way that an influence of, for example, desorbed water vapor on the process gas atmosphere in the processing arrangement 100 can be eliminated or reduced.

In accordance with various embodiments, the processing arrangement 100 can comprise a process chamber 102 for processing a substrate (i.e. illustratively a suitable process item) within a processing region 111. The processing region 111 is provided within the process chamber 102 correspondingly for the processing, e.g. coating, of one substrate or a plurality of substrates. To that end, by way of example, a processing device, e.g. a coating device, can be used (not illustrated). A substrate can for example be positioned in a stationary manner in the processing region 111 or be transported continuously through the processing region 111. A substrate to be processed can be transported by means of a suitable transport device, e.g. by means of transport rollers, transport belts, etc. (not illustrated), e.g. along a direction perpendicular to the illustrated directions 101, 103.

Without restricting the generality, the process chamber can comprise for example an upper chamber wall 102o, a lower chamber wall 102u and two lateral chamber walls 102s. The upper chamber wall 102o, the lower chamber wall 102u and the two lateral chamber walls 102s can be for example individual chamber walls which are connected (e.g. welded) to one another to form a closed chamber wall. In an analogous manner, the upper chamber wall 102o, the lower chamber wall 102u and the two lateral chamber walls 102s can be in each case sections of a closed circumferential chamber wall.

In this case, the process chamber 102 or the chamber wall of the process chamber 102 can have any suitable geometric shape; by way of example, the process chamber 102 or the chamber wall of the process chamber 102 can have a substantially rectangular or other polygonal cross section, as is illustrated for example in FIG. 1. In a similar manner, the process chamber 102 or the chamber wall of the process chamber 102 can have a circular or elliptic cross section, or other suitable cross-sectional shapes.

In accordance with various embodiments, the processing arrangement 100 can comprise an insulating structure 106 (also referred to as thermal insulation), which is arranged between the processing region 111 and each of the upper chamber wall 102o, the lower chamber wall 102u and the two lateral chamber walls 102s, respectively. Illustratively, the insulating structure 106 is arranged relative to the chamber wall of the process chamber 102 in such a way that the processing region is thermally insulated toward the outside.

In accordance with various embodiments, the insulating structure 106 can comprise a thermally insulating material. By way of example, the insulating structure 106 can comprise or consist of a ceramic material. Furthermore, the insulating structure 106 can comprise or consist of a porous material, e.g. a porous ceramic. Furthermore, the insulating structure 106 can comprise a multilayered material, wherein at least one of the layers is thermally insulating. Furthermore, the insulating structure 106 can be configured in the form of a multilayered radiation shield.

In accordance with various embodiments, the insulating structure 106 can be configured as gas-permeable at least in sections in such a way that a process gas 110 from the processing region 111 can flow out of the processing region 111 through the insulating structure 106 in the direction of each of the upper chamber wall 102o, the lower chamber wall 102u and the two lateral chamber walls 102s, respectively.

Illustratively, it is thus possible to provide within the processing region 111 a gas flow distribution that is directed away from the processing region 111 on all sides. It is thus possible to prevent or reduce a situation in which water vapor, which desorbs for example from the insulating structure 106, can propagate in the direction of the processing region 111. Illustratively, by means of the insulating structure 106 within the processing region 111 it is possible to provide an excess pressure relative to an outer region (which is formed between the insulating structure 106 and the process chamber 102).

In accordance with various embodiments, the processing arrangement 100 can comprise a gas channel 108 for collecting the process gas 110 that flows through the insulating structure 106. In this case, the gas channel 108 can be arranged between the insulating structure 106 and the chamber wall of the process chamber 102, e.g. each of the insulating structure 106 and the upper chamber wall 102o, the lower chamber wall 102u and the two lateral chamber walls 102s.

In accordance with various embodiments, the gas channel 108 can be arranged relative to the gas-permeable insulating structure 106 in such a way that the process gas that flows through the insulating structure can be pumped away.

In accordance with various embodiments, the gas channel 108 can be provided with a sufficiently large cross section, such that a pressure drop over the length of the gas channel 108 is negligibly small relative to the pressure drop over the gas-permeable insulating structure 106. Consequently, the gas channel 108 can be pumped out for example at one or else at a plurality of arbitrary locations, wherein it is simultaneously ensured that the process gas 110 flows out of the processing region 111 on all sides through the insulating structure 106. In accordance with various embodiments, the gas channel 108 can have one or a plurality of pumping-out openings 108p. If a plurality of pumping-out openings 108p are used for pumping the process gas 110 out of the gas channel 108, they need not be arranged on all sides of the processing region 111, but rather can be arranged only on one, only on two or only on three sides of the processing region 111.

Illustratively, the extraction of the process gas by suction can be transferred to the exterior of the process chamber 102. A sufficient number of outflow openings in the insulating structure 106 ensures, for example, that the desorbed water vapor does not reach the process item. In accordance with various embodiments, it is possible to provide a plurality of through openings in each section 106o, 106u, 106s of the insulating structure 106 which is arranged in the region of the chamber walls 102o, 102u, 102s. In accordance with various embodiments, the insulating structure 106 can comprise an arrangement of through holes, wherein provision is made of at least one through hole (e.g. having a diameter or a width of 1 cm) per area of 100 cm$^2$. Furthermore, the insulating structure 106 can comprise a porous, gas-permeable material, e.g. an open-pored ceramic.

In accordance with various embodiments, the insulating structure 106 can also comprise a multiplicity of insulating tiles that are assembled to form a substantially closed insulating structure 106. Here a gap can remain in each case between two adjacent insulating tiles, through which gap the process gas can flow. Furthermore, at least one through hole can be provided in each of the insulating tiles, such that process gas can flow through the at least one through hole.

In accordance with various embodiments, a porous material can have a porosity of more than 10%, e.g. a porosity in a range of approximately 10% to approximately 90%, e.g. in a range of approximately 50% to approximately 90%.

In accordance with various embodiments, the insulating structure 106 can also comprise a multiplicity of through holes and/or gaps (also referred to as outflow openings) that are arranged in a predefined grid or pattern.

If the respective outflow openings are arranged at a distance from one another, for example the process gas effects laminar flow around the inner insulation areas of the insulating structure 106, wherein thus the desorbed water vapor is taken up or the process item is shielded against the desorbed water vapor. A prerequisite is that the pressure is high enough, such that a viscous flow is achieved. To that end, a pressure of at least 1 mbar can be provided for example in the processing region 111. The open-loop pressure control or the closed-loop pressure control can be effected by means of a process gas feed and a correspondingly configured open-loop gas flow control or closed-loop gas flow control. At the same time or as an alternative thereto, the process gas can also be pumped out of the processing region 111 or the gas channel 108 under open-loop or closed-loop control, e.g. by means of an open-loop control or closed-loop control of the suction power.

In accordance with various embodiments, the processing arrangement 100 can be configured in such a way that a substrate in the processing region 111 can be subjected to flow of a process gas (e.g. a carrier gas and/or a material vapor) as homogenously as possible, wherein as far as possible no (disturbing) gas can penetrate into the processing region 111 from outside or no (disturbing) gas can flow from the insulating structure 106 inward in the direction of the processing region 111.

In accordance with various embodiments, the gas channel 108 can be configured as extending circumferentially in a ring-shaped fashion, as is illustrated for example in FIG. 1. As an alternative thereto, the gas channel 108 can also be segmented.

Figure 2:
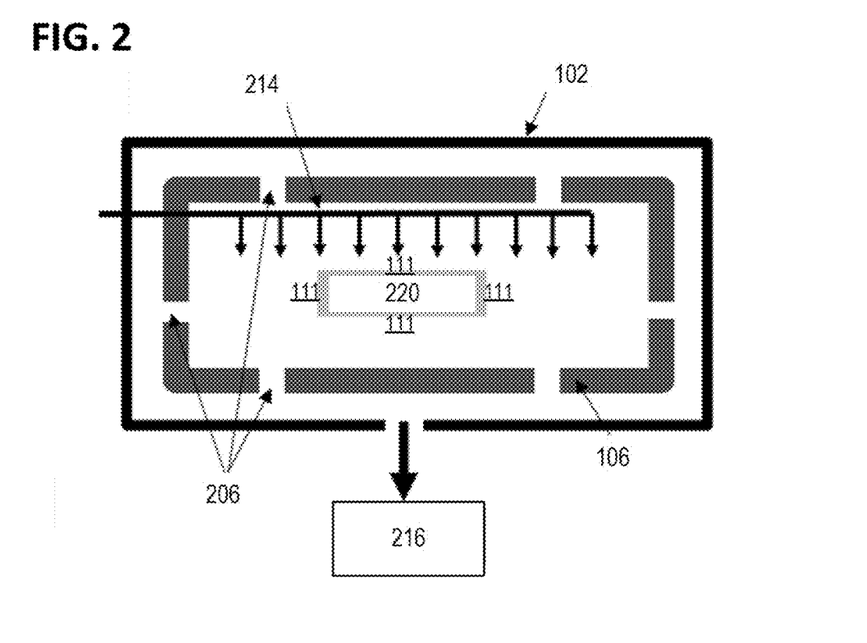
FIG. 2 shows a processing arrangement in a schematic side or cross-sectional view, in accordance with various embodiments.

FIG. 2 illustrates a processing arrangement 100 in a schematic view, in accordance with various embodiments. In this case, the processing arrangement 100 can be configured in a similar manner to the processing arrangement 100 illustrated in FIG. 1. In accordance with various embodiments, it is possible to introduce a process gas within the processing region 111 into the process chamber 102, e.g. by means of a process gas guide 214.

In accordance with various embodiments, it is possible to use a vacuum pump arrangement 216 for evacuating or pumping out the gas channel 108.

In accordance with various embodiments, the insulating structure 106 and the gas channel 108 can be configured in such a way that the flow resistance is greater through the outflow openings 206 of the insulating structure 106 than through the gas channel 108 (e.g. with more than double the magnitude or more than ten times the magnitude). In accordance with various embodiments, a diameter or a width of the gas channel 108 can be greater than a diameter or a width of the respective outflow openings 206 of the insulating structure 106 (e.g. with more than double the magnitude or more than ten times the magnitude). In accordance with various embodiments, an opening cross-sectional area of the gas channel 108 can be greater than an opening cross-sectional area of the respective outflow openings 206 of the insulating structure 106 (e.g. with more than double the magnitude or more than ten times the magnitude). Consequently, it is possible to stabilize for example the suction conditions in the processing region 111 on account of the different flow resistances.

A desorption of water, which can occupy very large internal surface areas in the case of porous insulants, can be driven out by means of heat treatment. The desorption progression is a function of time and of temperature. As is known, the temperature, in particular, has a considerable influence of the desorption rate. Furthermore, the temperature substantially defines the binding energy of the remaining adsorbed particles, i.e. particles which are still adsorbed after high-temperature heat treatment, are substantially strongly bound to the surface, and thus scarcely leave the surface at relatively low temperatures, which leads to a drastic reduction of the desorption rate after heat treatment.

In accordance with various embodiments, the fittings in the process chamber 102 and/or else at least in sections the process chamber 102 itself can be heated beyond the later operating temperature, such that the water is desorbed at a high rate. After a predefined holding time at elevated temperature, the lower process temperature can be set.

In this case, the desorption rate can decrease by a number of orders of magnitude. In this way it is possible to achieve water vapor partial pressures which, without baking, would take up enormously long pumping-out times.

In accordance with various embodiments, a processing arrangement 100 is provided which is configured in such a way that its inner fittings, in particular an insulating structure 106 for thermal insulation, can be soaked in the shortest possible time, such that, as described above, the water and other adsorbates can be efficiently driven out during a heat treatment. That concerns in particular the shielding insulations used in high-vacuum technology and also insulants, e.g. porous ceramic materials, or other insulating structures 106.

As is illustrated in FIG. 2, a substrate 220 (e.g. any suitable process item) can be positioned in the processing region 111. After the conditioning of the processing arrangement 100, the substrate 220 can be processed in the processing region 111 by means of a correspondingly configured processing device (not illustrated).

Figure 3A:
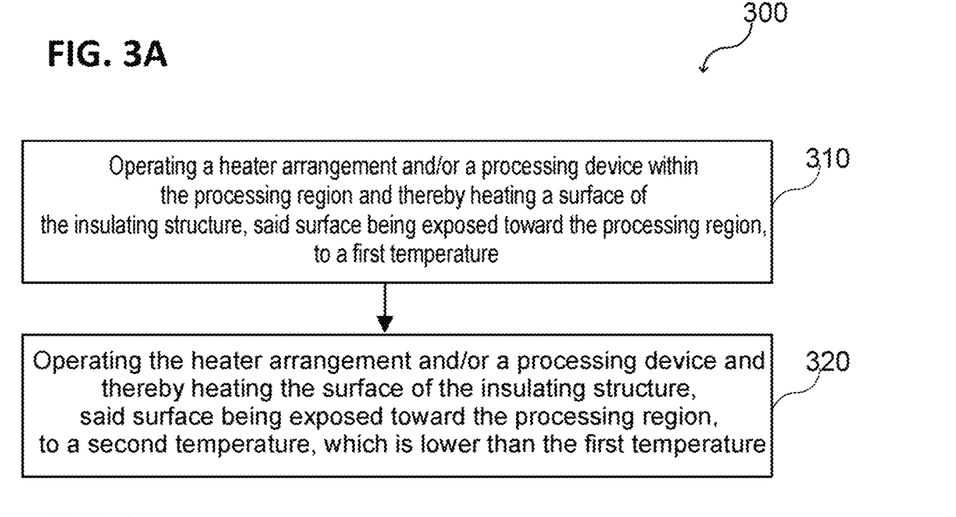
FIG. 3A shows a schematic flow diagram of a method for operating a processing arrangement, in accordance with various embodiments.

FIG. 3 illustrates a schematic flow diagram of a method 300 for operating or conditioning a processing arrangement, in accordance with various embodiments. In this case, the method 300 for example for operating the processing arrangement 100 described above can comprise the following: operating a heater arrangement (which is configured for example to heat the insulating structure 106 directly or indirectly) and/or a processing device (which is configured to process a substrate in the processing region 111, wherein the insulating structure 106 is simultaneously heated) within the processing region 111 and thereby heating a surface of the insulating structure 106, said surface being exposed toward the processing region 111, to a first temperature; and subsequently in 320, operating the heater arrangement and/or the processing device and thereby heating the surface of the insulating structure 106, said surface being exposed toward the processing region 111, to a second temperature, which is lower than the first temperature.

In other words, the method 300 can comprise the following, for example: in 310, operating a heater arrangement and/or a processing device within a processing region 111 of a process chamber 102 and thereby heating a surface of an insulating structure 106, which for example surrounds the processing region 111, said surface being exposed toward the processing region 111, to a first temperature; and subsequently in 320, operating the heater arrangement and/or the processing device and thereby heating the surface of the insulating structure, said surface being exposed toward the processing region, to a second temperature, which is lower than the first temperature.

Afterward, by way of example, a substrate can be processed (e.g. coated) in the processing region (e.g. in a coating region).

In accordance with various embodiments, the fittings in the process chamber 102 are heated from the direction of the processing region 111, i.e. illustratively from the inside. To that end, a heater arrangement and/or some other processing device (e.g. a coating device) can be operated in or at the processing region 111. Processing devices such as, for example, magnetrons for magnetron sputtering, electron beam evaporators, thermal evaporators or the like can for example themselves generate enough heat to heat up the processing region 111. A heater arrangement can for example be used in addition to a processing device or be part of the processing device.

The heating arrangement situated within the thermal insulation heats for example an inner side of the insulating structure 106, e.g. the inner plates of a multilayered shielding insulation or the inner surface of an insulating substance. While the inner shielding layers or the regions of the insulating substance that are near the surface can be brought to the baking temperature comparatively rapidly, the outer shielding layers or insulating substance regions assume higher temperatures only after a longer time, however.

Figure 3B:
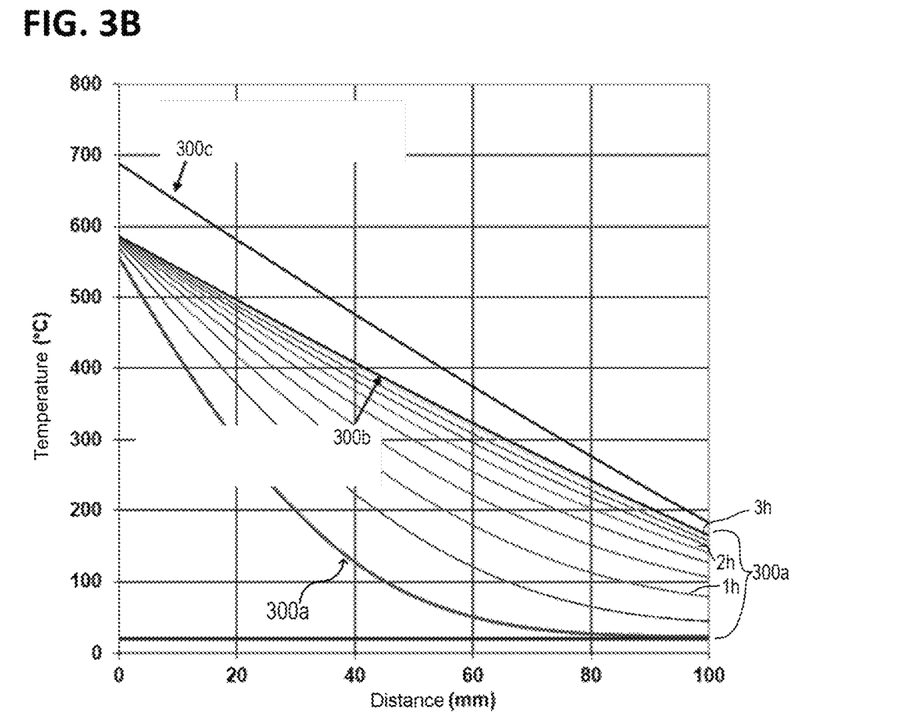
FIG. 3B shows various temperature distributions in a thermal insulation during baking and after baking of the insulation, in accordance with various embodiments.

FIG. 3B shows, in an exemplary diagram, the heating behavior 300a of a ceramic insulation of medium thermal mass (coefficient of thermal conductivity 0.35 W/m·K, density 800 kg/m$^3$; specific heat capacity 1000 Ws/kg·K), in accordance with various embodiments. In this example, the ceramic insulating structure 106 has a thickness of 100 mm. In accordance with various embodiments, the insulating structure 106 can have a thickness in a range of approximately 50 mm to approximately 500 mm.

As is illustrated in FIG. 3B, the temperature of the inner side of the insulating structure 106 (at 0 mm in the diagram) rapidly matches the heating temperature if said insulating structure is heated from the inside. However, it can be difficult to efficiently heat up the outer side of the insulating structure 106 (at 100 mm in the diagram) if the insulating structure 106 is heated only from the inside.

After a few hours, an equilibrium temperature distribution 300b is attained, illustrated for example for a heating temperature of 600° C. The equilibrium temperature distribution 300b is established for example starting from a heating duration of approximately 3 h. It becomes apparent that baking of an insulating structure 106 can require a comparatively long heating time and that the outer side of the insulating structure 106 is possibly not heated intensely enough to efficiently drive the water out of the insulating structure 106.

In accordance with various embodiments, materials that enable much faster heating times can be used as insulation. Said materials have for example a low density and/or a high porosity. However, materials of this type may be mechanically less stable and, without sealing, for example, tend toward the segregation of particles. If the materials used are not inherently stable, it is possible to provide cassettes, for example, which hold the insulation and line the insulating surface with suitable materials at least on the side facing the process. The use of said materials may be economically disadvantageous owing to the increased outlay. In principle, insulation materials should be sought which enable the energy costs to be minimized in conjunction with good heat insulation. Furthermore, the lowest possible heat capacities of the insulation material ought to be striven for. The heating times can be shortened as a result.

In accordance with various embodiments, it is possible to take account of the fact that a short cooling time is also possible and the maintenance of the installation can thus be carried out without long waiting times. In insulation concepts, the advantages and disadvantages outlined can be weighed up depending on the respective application.

In order to shorten the water desorption process, a targeted overheating 300c of the insulating structure 106 can be carried out, specifically over the entire thickness of the insulating structure 106. That is first of all possible for example by carrying out the heating with a temperature of 700° C., for example, over a time period of approximately 3 h, for example. In this case, the insulating structure 106 is brought over its entire thickness to a temperature that lies above the temperature under process conditions (e.g. at 600° C.). Higher baking temperatures accelerate the desorption. The limiting temperature of the heating arrangement and also of the process fittings limits the maximum possible heating temperature, for example.

A description is given below of configurations of a processing arrangement 100 which make it possible to considerably accelerate the desorption process. In accordance with various embodiments, use is made of an additional heating arrangement for heating the insulating structure 106 in the region of the outer side. By heating the insulating structure 106 from two mutually opposite sides, it is possible to achieve considerably higher temperatures in the insulation volume, as is illustrated in FIG. 5B, for example, and moreover within much shorter times, in half the time in the example illustrated.

The higher the temperature of the insulating structure 106, the more effectively the desorption can take place, in accordance with the Arrhenius behavior regarding temperature and time. At temperatures which lie considerably above the equilibrium temperature distribution in the insulating structure 106, the holding time at elevated temperature can accordingly be shortened very considerably, which increases the availability of the installation.

In accordance with various embodiments, the insulating structure 106 can be heated in the outer region, i.e. in a region of the insulating structure 106, which faces away from the processing region 111. In accordance with various embodiments, by way of example, the outer side can be occupied by a surface heating arrangement. By way of example, a heating line laid in a meandering shape can be used for heating the insulation structure 106. So-called mineral-insulated heating lines can be used in this case. Furthermore, it is possible to use at least one heating wire composed of Kanthal, e.g. composed of an alloy including iron, chromium, and aluminum or composed of a copper/nickel-based alloy. In this case, by way of example, a bare heating wire can be laid, wherein a heating wire carrier is used (that can be the insulation, for example), wherein the heating wire carrier can be configured for example in a manner composed of electrically insulating material and such that it is resistant to high temperatures. Individual heating bodies can also be used. Since a homogenous temperature distribution over the lateral extent of the insulating structure 106 is not necessary, it is possible to choose comparatively large distances between the heating bodies in order to minimize the capital expenditure. The outer heaters can be shielded in order to minimize the emission in the direction of the process chamber 102 or the chamber wall. This shielding can be effected by means of one plate layer or a plurality of plate layers. In accordance with various embodiments, the chamber wall cooling can be adapted to the increased thermal load during the overheating. The heating bodies can advantageously also be incorporated in trenches worked into the outer insulation surface. Expediently, the heating bodies in individual cases can also be incorporated in the insulation volume, for instance in cutouts, cavities, etc.

Figure 4A:
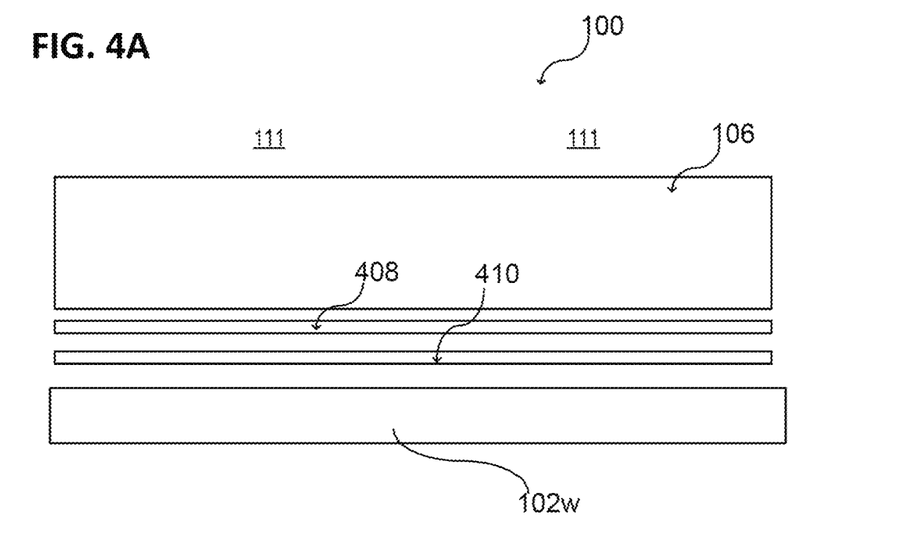
FIGS. 4A and 4B each show a detailed illustration of a processing arrangement in a schematic side or cross-sectional view, in accordance with various embodiments.
Figure 4B:
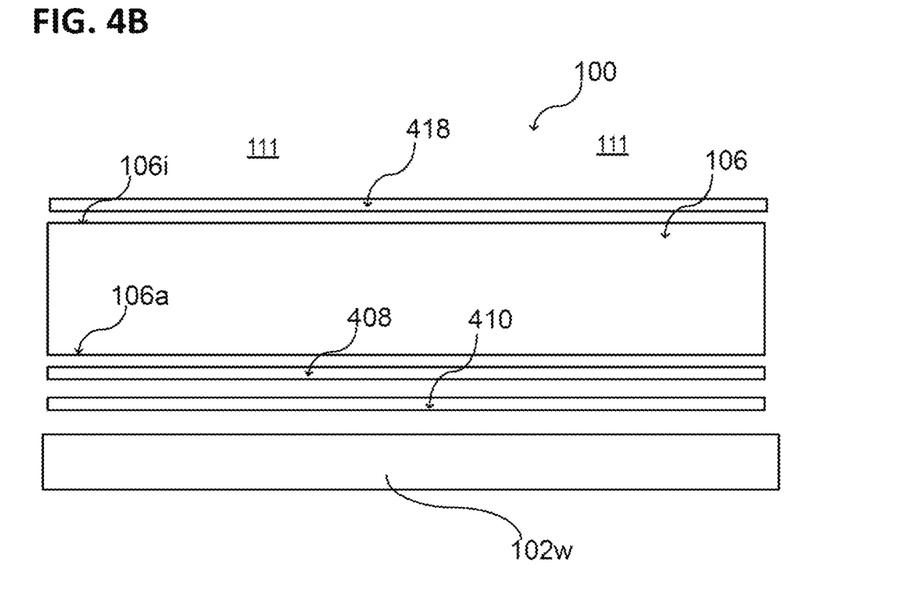

FIG. 4A and FIG. 4B each illustrate a processing arrangement in a schematic detailed view, in accordance with various embodiments. Here the processing arrangement 100 can comprise a process chamber 102 for processing a substrate within a processing region 111, for example a process chamber 102 as described above. Furthermore, the processing arrangement 100 can comprise an insulating structure 106, for example an insulating structure 106 as described above, wherein the insulating structure 106 is arranged between the processing region 111 and an inner chamber wall 102w of the process chamber 102, for thermally insulating the processing region 111 from the process chamber 102.

In accordance with various embodiments, the processing arrangement 100 can comprise a heating structure 408 for heating the insulating structure 106, wherein the insulating structure 106 is arranged partly or completely between the heating structure 408 and the processing region 111.

A thermal shielding 410 can be configured between the heating structure 408 and the chamber wall 102w of the process chamber 102.

As is illustrated in FIG. 4B, for example, a heater arrangement 418 can be arranged on a first side of the insulating structure 106 (e.g. on an inner side 106i facing the processing region 111). By means of said heater arrangement 418, the insulating structure 106 can be heated from a first direction. Furthermore, the heating structure 408 can be arranged on a second side—situated opposite the first side—of the insulating structure 106 (e.g. an outer side 106a facing away from the processing region 111).

In accordance with various embodiments, the heater arrangement 418 can be a separate heating arrangement that serves only for heating the insulating structure 106, or the heater arrangement 418 can be part of a processing device used for processing, e.g. coating, substrates in the processing region 111.

Figure 5A:
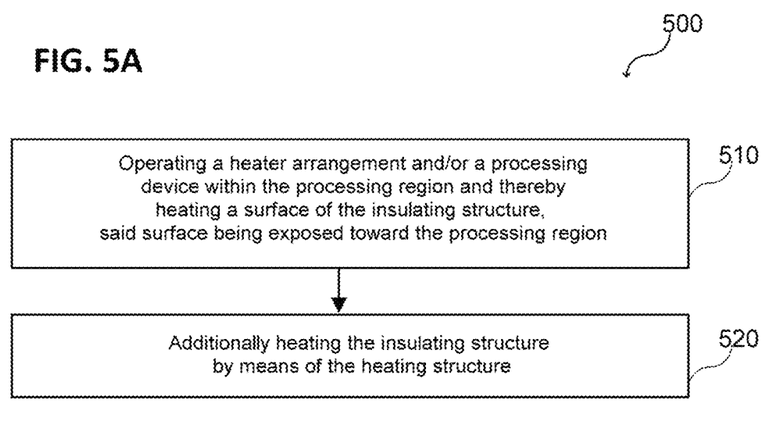
FIG. 5A shows a schematic flow diagram of a method for operating a processing arrangement, in accordance with various embodiments.
Figure 5B:
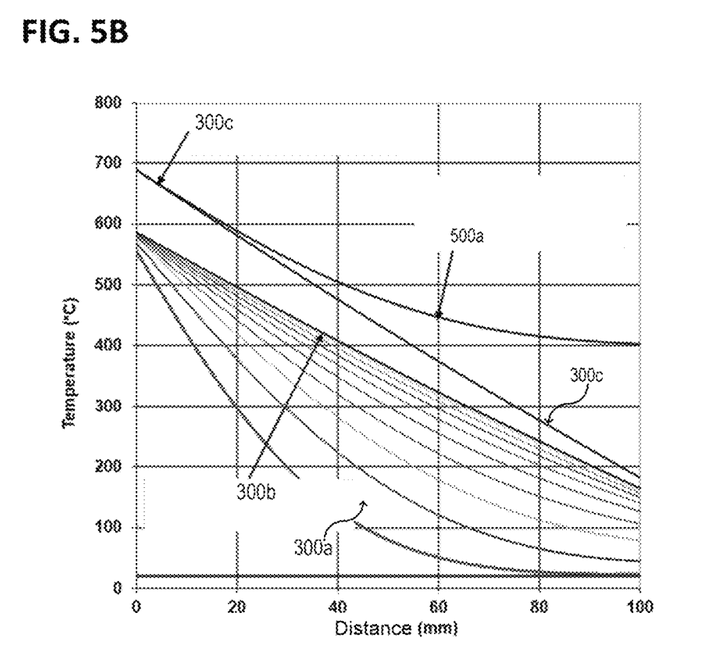
FIG. 5B shows various temperature distributions in a thermal insulation during baking and after baking of the insulation, in accordance with various embodiments.

FIG. 5A illustrates a schematic flow diagram of a method 500 for operating or conditioning a processing arrangement, in accordance with various embodiments. In this case, the method 500 for example for operating the processing arrangement 100 described above can comprise the following: in 510, operating a heater arrangement 418 and/or a processing device within the processing region 111 and thereby heating a surface of the insulating structure 106, said surface being exposed toward the processing region 111; and, at the same time, additionally heating the insulating structure 106 by means of the heating structure 408.

FIG. 5B shows, in an exemplary diagram, the heating behavior 300a, 300b, 300c of a ceramic insulation of medium thermal mass, as described above, and additionally a heating behavior 500a for the case where an additional heating structure 408 is used, as is illustrated in FIG. 4A, FIG. 4B and as can be implemented in accordance with the method 500.

As is illustrated in FIG. 5B, the outer side of the insulating structure 106 can thus also be brought to a sufficiently high baking temperature, such that, for example, water or other adsorbates can be driven out of the insulating structure 106. In this case, the curve 500a illustratively shows an exemplary baking profile for temperatures of 700° C. on the inner side of the insulating structure 106 (at 0 mm) and of 400° C. on the outer side of the insulating structure 106 (at 100 mm). The temperature profile 500a is already established after a heating duration of approximately 1.5 h, that is to say that the insulating structure 106 can be soaked significantly more rapidly, compared with the temperature profile 300c for single-side heating of the insulating structure 106 at 700° C. and with a heating duration of 3 h.

A description is given below of various examples, which relate to what has been described and illustrated above.

Example 1 is a processing arrangement 100, including: a process chamber 102 for processing a substrate within a processing region 111, wherein the process chamber 102 includes an upper chamber wall 102o, a lower chamber wall 102u and two lateral chamber walls 102s; an insulating structure 106, which is arranged between the processing region 111 and each of the upper chamber wall 102o, the lower chamber wall 102u and the two lateral chamber walls 102s, respectively, for thermally insulating the processing region 111, wherein the insulating structure 106 is configured as gas-permeable at least in sections in such a way that a process gas 110 from the processing region 111 can flow out of the processing region 111 in the direction of each of the upper chamber wall 102o, the lower chamber wall 102u and the two lateral chamber walls 102s, respectively, through the insulating structure 106; and a gas channel 108, which is arranged between the insulating structure 106 and each of the upper chamber wall 102o, the lower chamber wall 102u and the two lateral chamber walls 102s, respectively, for pumping away the process gas 110 which flows through the insulating structure 106.

The insulating structure 106 can comprise an upper section 106o, which is arranged between the processing region 111 and the upper chamber wall 102o, and also a lower section 106u, which is arranged between the processing region 111 and the lower chamber wall 102u, and two lateral sections 106s, which are respectively arranged between the processing region 111 and the two lateral chamber walls 102s, for thermally insulating the processing region 111 from the process chamber 102. The insulating structure 106 can comprise channels, through holes or gaps (also referred to as outflow openings) which extend continuously from the inside outward and through which a gas can flow through the insulating structure 106. The insulating structure 106 can extend along the inner wall of the chamber. The insulating structure 106 can surround the processing region 111 substantially (e.g. radially with respect to the transport direction) completely.

In example 2, the processing arrangement 100 in accordance with example 1 can furthermore comprise the fact that the insulating structure 106 and the gas channel 108 are configured in such a way that the flow resistance is greater through the insulating structure 106 than through the gas channel 108. The flow resistance through the insulating structure 106 can be of more than double the magnitude or more than ten times the magnitude of the flow resistance through the gas channel 108.

In example 3, the processing arrangement 100 in accordance with example 1 or 2 can furthermore comprise the fact that the gas channel 108 includes at least one pumping-out opening 206 for pumping out the gas channel 108 by means of a vacuum pump arrangement 216.

In example 4, the processing arrangement 100 in accordance with any of examples 1 to 3 can furthermore comprise a process gas guide 214 for introducing the process gas 110 into the processing region 111.

In example 5, the processing arrangement 100 in accordance with example 4 can furthermore comprise a vacuum pump arrangement 216 for evacuating the gas channel 108. In accordance with various embodiments, the vacuum pump arrangement 216 can be coupled to the gas channel 108 directly or indirectly (e.g. via one or more vacuum supply pipes).

In example 6, the processing arrangement 100 in accordance with example 5 can comprise the fact that the process gas guide 214 and the vacuum pump arrangement 216 are configured in such a way that a pressure of more than 1 mbar is provided in the processing region 111. Furthermore, the process gas guide 214 and the vacuum pump arrangement 216 can be configured in such a way that a pressure provided in the gas channel 108 (e.g. in every region within the gas channel 108) is lower than that provided in the processing region 111.

In example 7, the processing arrangement 100 in accordance with example 6 can comprise the fact that the vacuum pump arrangement 216 is configured in such a way that it accesses the gas channel 108 only from one side of the process chamber 102.

In example 8, the processing arrangement 100 in accordance with any of examples 1 to 7 can furthermore comprise a heating structure 408 for heating the insulating structure 106.

In example 9, the processing arrangement 100 in accordance with example 8 can comprise the fact that the insulating structure 106 is arranged partly or completely between the heating structure 408 and the processing region 111.

In accordance with various embodiments, the heating structure 408 can be arranged at an outer side of the insulating structure 106. Furthermore, the heating structure 408 can be partly or completely embedded into the insulating structure 106.

Example 10 is a processing arrangement 100, including: a process chamber 102 for processing a substrate within a processing region 111; an insulating structure 106, which is arranged between the processing region 111 and an inner chamber wall 102w of the process chamber 102, for thermally insulating the processing region 111 from the process chamber 102; and a heating structure 408 for heating the insulating structure 106, wherein the insulating structure 106 is arranged partly or completely between the heating structure 408 and the processing region 111.

In example 11, the processing arrangement 100 in accordance with example 10 can comprise the fact that the insulating structure 106 is configured as gas-permeable at least in sections in such a way that a process gas 110 from the processing region 111 can flow out of the processing region 111 in the direction of the inner chamber wall 102w through the insulating structure 106.

In example 12, the processing arrangement 100 in accordance with example 11 can furthermore comprise a gas channel 108, which is arranged between the insulating structure 106 and the inner chamber wall 102w, for pumping away the process gas 110, which flows through the insulating structure 106.

In example 13, the processing arrangement 100 in accordance with any of examples 1 to 12 can furthermore comprise a processing device for processing a substrate 220 within the processing region 111.

In example 14, the processing arrangement 100 in accordance with any of examples 1 to 12 can furthermore comprise a coating device for coating a substrate 220 within the processing region 111.

In example 15, the processing arrangement 100 in accordance with example 14 can comprise the fact that the coating device is configured to introduce a pulverulent material into the processing region 111 by means of the process gas 110 and to evaporate the pulverulent material within the processing region 111 for the purpose of coating the substrate by means of the evaporated material.

In accordance with various embodiments, the process gas 110 in accordance with the previous examples can be or comprise an inert gas (e.g. argon, helium, nitrogen, etc.) or a reactive gas (e.g. oxygen, hydrogen, etc.).

Example 16 is a method for conditioning a processing arrangement 100 in accordance with any of examples 1 to 15, the method including: operating a heater arrangement 418 and/or a processing device within the processing region 111 and thereby heating a surface of the insulating structure 106, said surface being exposed toward the processing region 111, to a first temperature; and subsequently operating the heater arrangement 418 and/or the processing device and thereby heating the surface of the insulating structure 106, said surface being exposed toward the processing region 111, to a second temperature, which is lower than the first temperature.

In accordance with various embodiments, the first temperature can be more than 50° C. or more than 100° C. higher than the second temperature. In accordance with various embodiments, the first temperature can be provided for a heating duration of more than 1 h. In accordance with various embodiments, the second temperature can be in a range of approximately 400° C. to approximately 650° C.

Example 17 is a method for conditioning a processing arrangement 100 in accordance with any of examples 8 to 12, the method including: operating a heater arrangement 418 and/or a processing device within the processing region 111 and thereby heating a surface of the insulating structure 106, said surface being exposed toward the processing region 111; and, at the same time, additionally heating the insulating structure 106 by means of the heating structure 408.

In accordance with various embodiments, the heating from inside can be carried out with a higher temperature than the additional heating from outside by means of the heating structure 408.

What is claimed is:

1. A processing arrangement, comprising:
   a process chamber for processing a substrate within a processing region, wherein the process chamber comprises an upper chamber wall, a lower chamber wall and two lateral chamber walls;
   an insulating structure, which is arranged between the processing region and each of the upper chamber wall, the lower chamber wall and the two lateral chamber walls, respectively, for thermally insulating the processing region, wherein the insulating structure is configured as gas-permeable at least in sections in such a way that a process gas from the processing region can flow out of the processing region in a direction of each of the upper chamber wall, the lower chamber wall and the two lateral chamber walls, respectively, through the insulating structure; and
   a gas channel, which is arranged between the insulating structure and each of the upper chamber wall, the lower chamber wall and the two lateral chamber walls, respectively, for pumping away the process gas which flows through the insulating structure;
   a coating device for coating the substrate within the processing region, wherein the coating device is configured to introduce a pulverulent material into the processing region by means of the process gas and to evaporate the pulverulent material within the processing region for the purpose of coating the substrate by means of the evaporated material.

2. The processing arrangement as claimed in claim 1, wherein the insulating structure and the gas channel are configured in such a way that a flow resistance through the insulating structure is greater than through the gas channel.

3. The processing arrangement as claimed in claim 1, wherein the gas channel comprises at least one pumping-out opening for pumping out the gas channel.

4. The processing arrangement as claimed in claim 3, further comprising:
   a process gas guide for introducing the process gas in to the processing region.

5. The processing arrangement as claimed in claim 4, wherein the process gas guide extends through the insulating structure.

6. The processing arrangement as claimed in claim 4, further comprising:
   a vacuum pump arrangement for pumping out the gas channel.

7. The processing arrangement as claimed in claim 6, wherein the process gas guide and the vacuum pump arrangement are configured in such a way that a pressure of more than 1 mbar is provided in the processing region.

8. The processing arrangement as claimed in claim 7, wherein the vacuum pump arrangement is configured in such a way that it accesses the gas channel only from one side of the process chamber.

9. The processing arrangement as claimed in claim 1, furthermore comprising:
   a heating structure for heating the insulating structure.

10. The processing arrangement as claimed in claim 9, wherein the insulating structure is arranged partly or completely between the heating structure and the processing region.

11. The processing arrangement as claimed in claim 1, wherein a pressure provided in the gas channel is lower than that provided in the processing region.

12. The processing arrangement as claimed in claim 1, wherein the insulating structure comprises a ceramic material or is formed from a ceramic material.

13. The processing arrangement as claimed in claim 1, wherein each of the sections includes an opening extending through the insulating structure.

* * * * *